Inventors:
Frederick N. Jacob,
Earl R. Stout and
Leonard Miller,
By Dawson, Ooms, Booth and Spangenberg,
Attorneys.

Inventors.
Frederick N. Jacob,
Earl R. Stout and
Leonard Miller,
By Dawson, Ooms, Booth and Spangenberg,
attorneys.

Patented Dec. 12, 1950

2,533,810

UNITED STATES PATENT OFFICE 2,533,810

WIDE BAND CALIBRATED TUNER AND INDUCTOR FOR USE THEREWITH

Frederick N. Jacob, Earl R. Stout, and Leonard Miller, Chicago, Ill., assignors to Aladdin Industries, Incorporated, Chicago, Ill., a corporation of Illinois Application August 13, 1949, Serial No. 110,176

9 Claims. (Cl. 250—40)

Our invention relates to an improved tuner capable of tuning a plurality of circuits over a wide frequency band with a predetermined frequency-tuning movement characteristic and good tracking, and an inductor for use therewith.

In tuners for television use it is necessary to cover two spaced frequency bands, one band extending from approximately 57 mc. to about 85 mc. (channels 2 to 6) and the other band extending from approximately 177 mc. to about 213 mc. (channels 7 to 13). Since this is a very wide frequency spread, and the tuner must cover this spread despite the constant circuit and capacitance values, it is necessary to provide a tuner with a very wide range of variation. Moreover, since the frequency spectrum intermediate the spaced bands contains no television stations, it is desirable to cover this frequency range with a relatively small tuning movement. However, since this frequency spectrum may contain other stations, such as FM stations, it is desirable that the tuner cover this spectrum so that these stations may be tuned if desired.

Conventional tuners are incapable of covering the wide television frequency range because the limits of tuning are restricted. For example, a tuner of the movable core type reaches its maximum frequency with the core withdrawn and the frequency thus established places a maximum limit on the number of turns. The minimum frequency is fixed by the inductance with the core fully inserted and the difference as compared with the maximum frequency is limited by the characteristics of available core materials. For these reasons it has not heretofore been possible to cover the full television frequency range with a single tuning element.

A further desirable characteristic of a tuner for television purposes is that it cover the desired frequency range with good calibration and tracking despite manufacturing tolerances.

It is therefore a general object of the present invention to provide an improved tuner suitable for television use.

Another object of the present invention is to provide an improved inductor capable of covering the full frequency range of the television channels.

Further it is an object of the present invention to provide an improved calibrated tuner capable of covering the full television frequency bands with good accuracy.

Yet another object of the present invention is to provide an improved variable inductor capable of covering a wide frequency range and adapted to be calibrated at three points in the tuning range.

Further it is an object of the present invention to provide an improved tuner capable of tuning a plurality of circuits in unison over the television frequency bands with good accuracy and good tracking.

Our invention further resides in providing a tuner capable of tuning over the frequency spectrum intermediate the two television bands as well as the television bands themselves.

The novel features which we believe to be characteristic of our invention are set forth with particularity in the appended claims. Our invention itself, however, both as to its organization and method of operation, can best be understood by reference to the following description taken in connection with the accompanying drawings, in which:

*The tuner*

Figure 1:
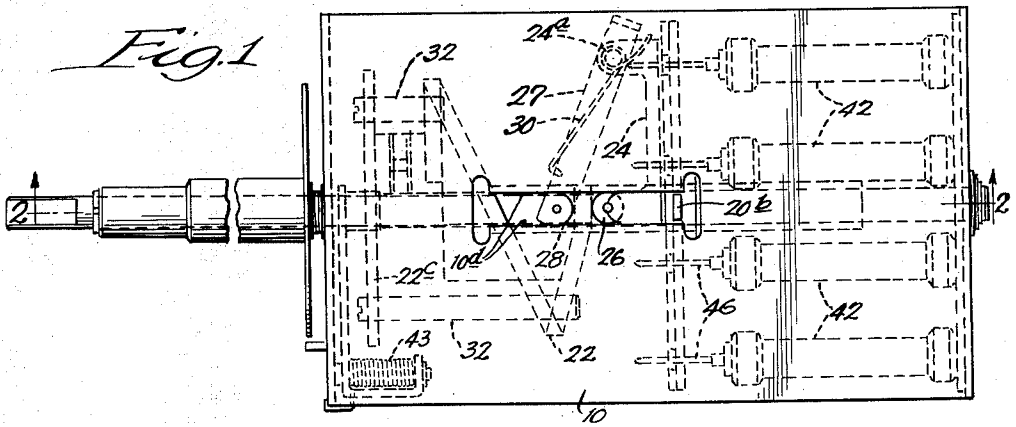
Figure 1 is a top plan view of a tuner constructed in accordance with the principles of the present invention.
Figure 2:
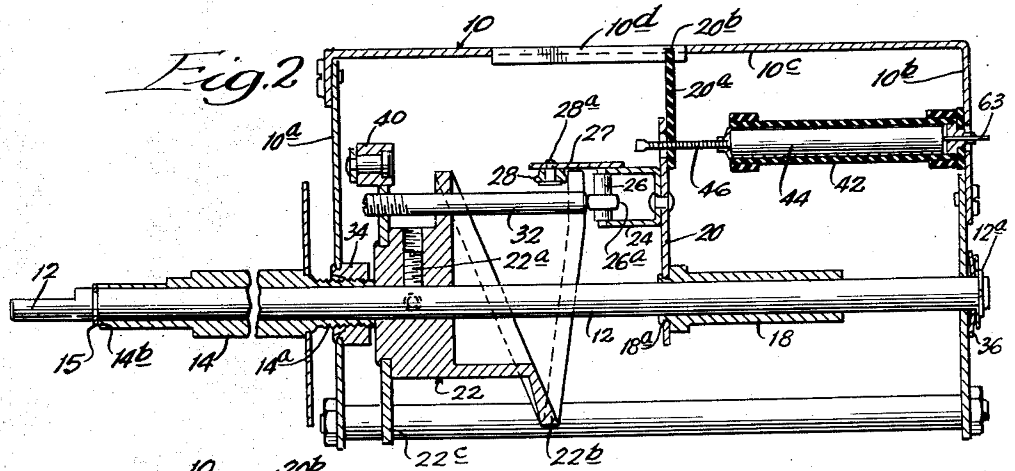
Figure 2 is a side elevational view of the structure of Figure 1.
Figure 3:
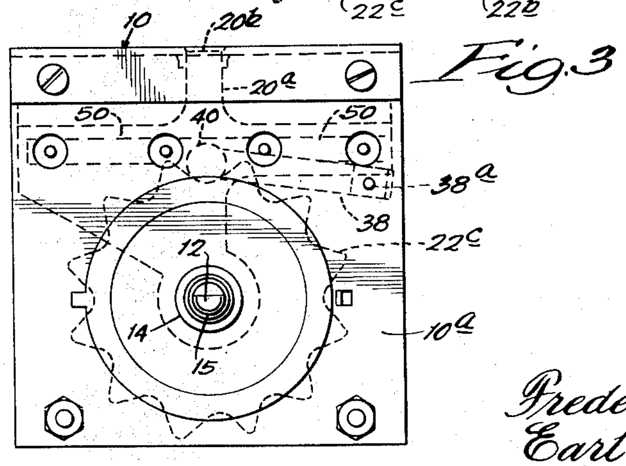
Figure 3 is a front elevational view of the structure of Figure 1.

Referring now to Figures 1 to 3, there is shown at 10 a frame having forward and rear panels 10*a* and 10*b*, respectively, and a top panel 10*c*. A shaft 12 extends longitudinally of the frame. The shaft is received by the hollow shaft 14 which is in turn received on the front panel 10*a*. The shaft 12 is supported from the rear panel 10*b* by the disk type spring washer 36, Figure 2.

The shaft 12 slidingly receives the collar 18 which at its forward end 18*a* defines an annular groove in which the carriage plate 20 is snugly received. An insulating plate 20*a* of phenol formaldehyde condensation product or like material is affixed to carriage plate 20. Plate 20*a* has an upwardly extending protuberance 20*b* which is received in the elongated guide slot 10d of the top plate 10c.

The slot 10d, coacting with the protuberance 20b, holds plate 20 against rotation and confines that plate to translational movement longitudinally of the shaft 12. This movement is controlled by the cam mechanism described in further detail hereafter.

The shaft 12 carries the cam 22 in the region between carriage plate 20 and front plate 10a. This cam is rigidly secured to the shaft 12 by the set screw 22a so that the cam rotates with the shaft. As shown, the cam 22 defines a spiralled surface 22b adapted to receive a cam follower.

The carriage 20 is attached to the bracket 24 which carries the vertical roller 26. This roller has an enlarged portion 26a which rides on the rear face of the cam spiral 22b. The bracket 24 extends along the plate 20 as indicated in Figure 1 and terminates in forwardly extending support 24a. Support 24a rockably carries the arm 27 which, as shown in Figure 1, extends to a point opposite roller 26. At its end, the arm 27 receives a roller 28 which is held to the arm by a suitable pin 28a.

The arm 27 is biased by spring 30, Figure 1, to hold the roller 28 against the forward surface of cam spiral 22b. Since the carriage plate 20 is free to move longitudinally to the shaft 12, this causes the carriage plate to follow by shifting movements the rotations of the shaft 12.

The cam 22 carries a series of pins 32. Each of these pins is threadedly received in the star plates 22c which is rigidly attached to the cam 22. Each pin extends rearwardly through appropriate openings in the cam 22 to a point on the rear face of the cam spiral 22b.

One pin 32 corresponds to each station channel desired to be tuned and rides against roller 26a when the tuner is adjusted to that station. Each pin can be individually adjusted to take up any departures in the shape of cam spiral 22b from the proper shape. These adjustments are made by suitable slots in the forward end of each pin.

Vernier adjustments of the carriage plate 20 are achieved by rotation of the shaft 14. This shaft is threadedly held at portion 14a to the front plate 10a by the threaded collar 34. As the shaft 14 is rotated, the front face 14b is shifted relative to the front panel 10a and the entire assembly comprising cam 22, shaft 12, and carriage plate 20, is shifted against the bias of the disk spring 36. The latter spring bears against rear panel 10b and the washer 12a at the rear end of shaft 12 to hold the front end of shaft 12 (and hence the snap collar 15) snugly against the front face 14b of the shaft 14.

The shaft 12 is releasably held in any one of the station positions by the star wheel 22c, Figure 3, which is affixed to the cam 22. As shown, this wheel has a plurality of indentations, one corresponding to each station. An arm 38, Figure 3, is rockably secured to the front plate 10a by the pin 38a. This arm carries roller 40, Figure 2, at its outer end. The arm 38 is biased by spring 43, Figure 1, to hold the wheel 40 against the periphery of wheel 22c and cause the shaft 12 to snap into the various positions corresponding to the station channels.

A plurality of inductors 42 are mounted on the rear panel 10b. Each of these inductors has a cooperating tuning sleeve 44, Figure 2, which is adjustably held on the carriage plate 20 by coiled wire supports 46, each support being threadedly received in the portion 20a of the carriage plate 20. Each inductor 42 has a magnetic core 60, Figure 4, positioned interiorly of the movable tuning sleeve 44.

From the foregoing description it will be evident that the tuner structure of Figures 1 to 3 adjustably positions the sleeves 44 relative to the inductors 42. The relative positions are determined by the rotation of the shaft 12, the setting of the vernier shaft 14, the adjustment of the pins 32, and the settings of the individual threaded connections between each coiled wire 46 and the carriage plate 20.

*The inductor*

In accordance with the present invention an improved inductor is provided for use in the tuner of Figures 1 to 3 or a similar tuner. The construction of this inductor is shown in enlarged view in Figures 4 and 5.

Figure 4:
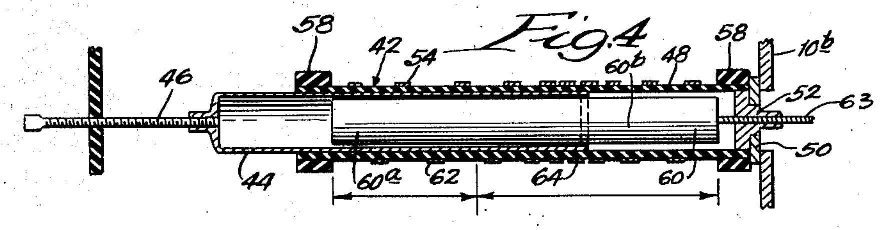
Figure 4 is an axial cross-sectional view of an inductor constructed in accord with the principles of the present invention.
Figures 5, 7:
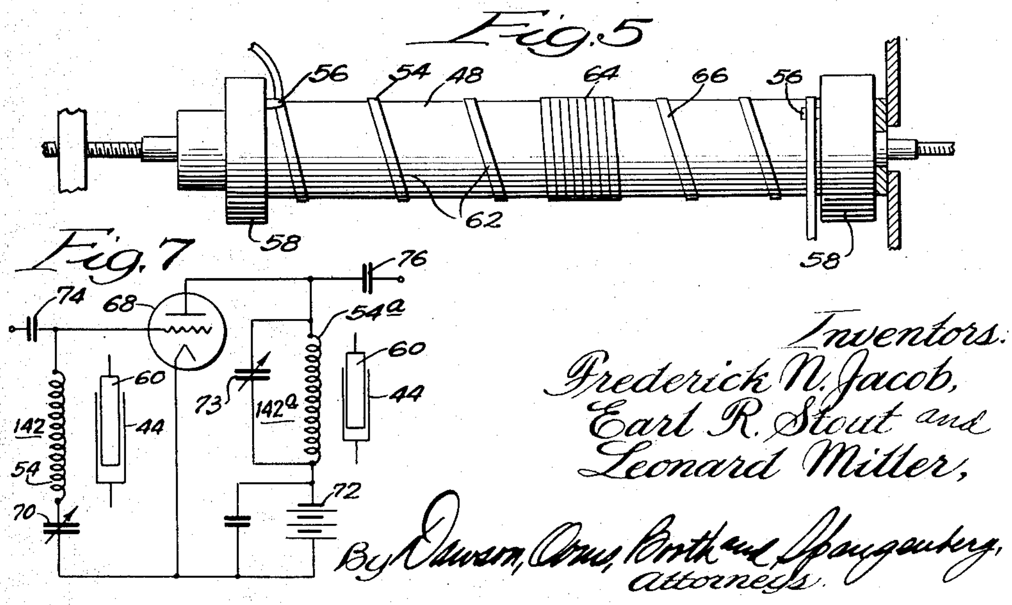
Figure 5 is a side elevational view of the inductor of Figure 4.
Figure 7 is a schematic circuit diagram of an amplifier having two tuned circuits constructed in accordance with the principles of the present invention.

As shown in Figures 4 and 5, the tuner has a longitudinal sleeve or tube 48 of a phenol-formaldehyde condensation product or other low loss insulating material. This tube is supported from the back panel 10b by the strip 50 of insulating material which snugly receives the projecting portion of the insert 52. Insert 52 in turn is snugly received by sleeve 48 to hold that sleeve in position. As shown in Figure 3, the strip 50 extends across the panel 10b and holds a plurality of inductors. It is secured to the panel by any suitable means, such as rivets.

A strip of copper or similar low loss conducting material 54 is wrapped spirally about the tube 48. This strip is secured by the inserts 56, Figure 5, which are snugly held between the end sleeves 58 and the sleeve 48. Preferably the strip 54 is attached to the inserts 56 by soldering.

The strip 54 extends away from the tube 48 adjacent the points of attachment to the inserts 56.

A magnetic core 60 is mounted inside the tube 48 and the winding formed by the strip 54. This core is held in position by the coiled wire 62 which defines a threaded outer surface and is threadedly received in the insert 52. The core 60 is formed over the forward end of the wire 62.

The core 60 and the sleeve 48 define an annular space to receive the low loss conducting sleeve 44. The effective inductance of the coil defined by strip 62 is varied by shifting this sleeve into and out of the coil.

The pitch of the spiral defined by the strip 54 is varied along the length of the tube 48. Consequently, as the sleeve 44 encircles increased portions of the core 60, the number of turns of the coil affected by a predetermined sleeve movement is varied. This varies the rate of inductance change with tuning movement.

Preferably the pitch of the turns of the coil defined by strip 62 is varied along the length of the coil and the pitch of the cam spiral 22b is varied along the length of the cam so that the station channels desired to be tuned are spaced by substantially equal rotations of the shaft 12.

Figure 6:
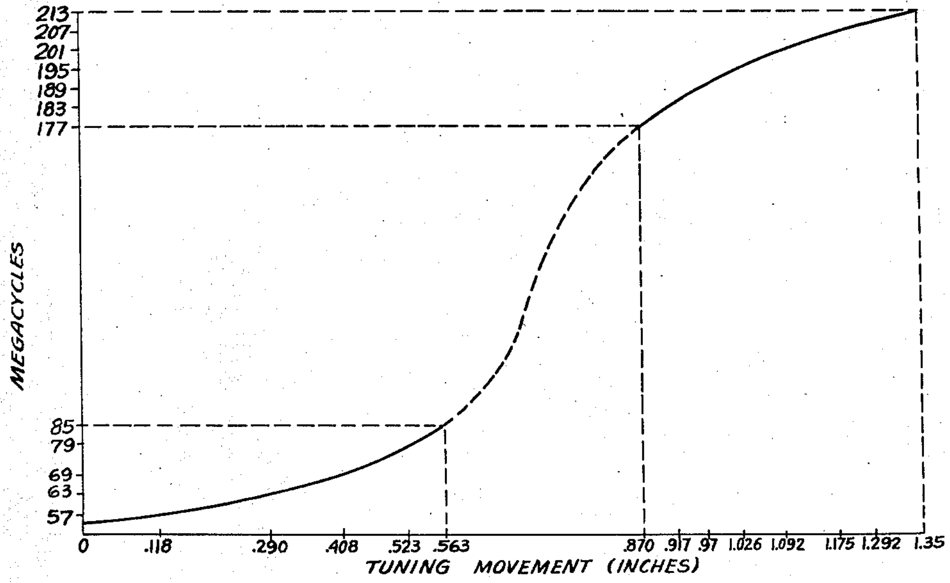
Figure 6 is a chart showing the tuning curve of the inductor of Figures 4 and 5.

In accordance with the present invention the pitch of the winding formed by conductor 54 is varied to cause a relatively small tuning movement near the center of the range of tuning sleeve travel to cover the relatively large frequency range between the two spaced television frequency bands. This is accomplished by winding the strip 54 to form two spaced portions 62 and 66 with relatively low turn density and an intermediate portion 64 of relatively great turn density. As the sleeve 44 is inserted, it first affects the relatively widely spaced turns 62 to increase the tuning frequency progressively to cover the low frequency band. This is the movement that covers the 57 to 85 mc. frequency range (channels 2 to 6) as shown in Figure 6.

When the tuning sleeve 44 reaches the closely spaced turns 64, the frequency change with tuning movement increases. The sleeve rapidly renders the turns 64 ineffective so as to increase the tuning frequency to 177 mc. as shown in Figure 6.

After the tuning sleeve has passed the turns 64, it encounters the more widely spaced turns 66. These turns correspond to the high frequency end of the tuning range and the high frequency television band. This band covers the frequency range from 177 mc. to 213 mc. (channels 7 to 13). As shown in Figure 6, the frequency change with tuning movement in this region is similar to that in the low frequency band.

With some core materials it is desirable to divide the core 60 into two sections, one corresponding to the low frequency band and the other corresponding to the high frequency band. The former section, 60*a*, is placed under the turns 62 and is made of core material having good permeability, even if the material is unsatisfactory for use in the high frequency band due to large energy losses. Since this material is ineffective at the high frequencies because of the shielding action of sleeve 44, its poor characteristics at these frequencies do not influence the high frequency performance of the unit.

The high frequency portion of the core, 60*b*, is made of a material having good characteristics in the high frequency band, even if this requires a reduction in permeability.

Figure 7 shows the schematic diagram of a tuned radio frequency amplifier utilizing the inductor of Figures 4 and 5 and the tuner of Figures 1 to 3. As shown, an inductor 142 is connected in series with trimmer capacitor 70 between the control electrode and the cathode of electron tube 68. Inductor 142 defines a resonant circuit in conjunction with trimmer capacitor 70. Similarly, the inductor 142*a* is connected in series with unidirectional voltage source 72 between the anode and cathode of electron tube 68. Inductor 142*a* defines a resonant circuit in conjunction with the trimmer capacitor 73. Input voltage is fed to the amplifier through coupling capacitor 74 and output voltage is taken from capacitor 76.

Inductors 142 and 142*a*, Figure 7, represent two of the inductors 42 on the tuner of Figures 1 to 3. When the shaft 12 is rotated, the movable sleeves of these tuners are moved in unison to tune the circuits of Figure 7 in tracked relationship.

As described in Donald R. De Tar patent application Serial No. 42,607, entitled Sleeve Tuner, filed August 5, 1948, the use of the movable sleeve 44 to tune the inductor 42 permits control of the circuit Q as the tuning is adjusted. Preferably the Q is increased in proportion to the tuning frequency to maintain a constant band width of the circuit.

*Calibration*

It is necessary in a practical television tuner to select stations positively without any chance of receiving the wrong station or deviating so far from the desired station that the vernier mechanism is incapable of tuning the desired station. Moreover, the several circuits must maintain their aligned or tracking conditions during tuning. However, practical manufacturing tolerances must be allowed for in the various portions of the structure to permit manufacture at reasonable cost. These two conflicting requirements become very severe in the case of a tuner intended to cover a wide frequency range, particularly if the frequency range encompasses two bands, since deviations from the design characteristics of any of the components cause progressive deviations from the intended calibration curve with the consequent loss of calibration and departure from the tracked condition.

In accordance with the present invention the manufacturing tolerances for the component parts are accommodated by a three point calibration made possible by the use of the movable cores, the movable sleeves, and the variable trimmer capacitors. By adjusting these elements to secure exact calibration at selected critical frequencies, the effect of manufacturing tolerances on the over-all calibration curve and tracking characteristic is brought within permissible limits.

In calibrating the tuning system, the carriage plate 20 is advanced by rotation of shaft 12 until the sleeves 44 are fully inserted. This is the position corresponding to the highest frequency channel, namely 213 mc. The trimmer capacitors for the various inductors are then adjusted until each is tuned to this frequency.

Since the magnetic cores 60 are fully encircled by the sleeves 44 in this position, the exact adjustment of the cores does not influence the setting of the trimmer capacitors. Moreover, the resonant frequency is relatively insensitive to movements of the tuning sleeves when the sleeves are fully inserted and the positions of the tuning sleeves are therefore not critical.

The shaft 12 is then rotated to the position corresponding to the lowest frequency channel, namely 57 mc. With this adjustment, the sleeves 44 are fully withdrawn and the resonant frequency is largely determined by the exact positions of the cores 60. Each inductance is tuned by rotation of the support 63 to adjust the position of the corresponding core 60 to tune the 57 mc. channel.

Since the tuning is relatively insensitive to sleeve movement at the low frequency end of the tuning range, the exact sleeve position is not critical in setting the positions of the cores. The trimmers are left in the position of adjustment fixed by the initial high frequency calibration when the position of the corresponding cores 60 are adjusted.

Following the foregoing adjustments, the shaft 12 is rotated to the position corresponding to channel 6 (85 mc.). At this channel the tuning sleeve position is most critical and the greatest frequency change results from a given tuning movement. The spring support 46 is rotated with the shaft 12 set for the channel 6 position until the inductor is tuned to the 85 megacycle frequency, thus providing an exact calibration of the inductor at this critical position.

Since the tuner is almost as sensitive to sleeve movement at channel 7 (177 mc.), the calibration may, if desired, be made at this frequency.

After the unit has been calibrated at the minimum, maximum, and intermediate tuning positions, the foregoing steps are repeated to compensate for any interrelationship between the tuning settings.

We have found that the tuner of the present invention is easily calibrated to accommodate generous manufacturing tolerances and that once the foregoing calibration is made, the calibration of each production tuner displays no substantial departure from the standard calibration curve. Moreover, the various tuned circuits retain their tracked condition over the entire tuning range.

A radio frequency transformer having features in common with the tuner and inductance of the present invention is described and claimed in a copending application entitled Radio Frequency Transformer, S. N. 114,294, filed September 7, 1949, assigned to the same assignee as the present invention.

The frequency spectrum intermediate the spaced television bands may include stations of interest, such as frequency modulated broadcast stations. If it is desired to tune these stations as well as the television stations, the tuner of Figures 1, 2, and 3 may be provided with mechanical elements operable to move the carriage 20 over the range of movement associated with these frequencies.

While we have shown and described a specific embodiment of our invention, it will, of course, be understood that we do not wish to be limited thereto and that by the appended claims we intend to cover all modifications and alternative constructions as fall within the true spirit and scope of our invention.

What we claim as new and desire to secure by Letters Patent of the United States is:

1. A multicircuit tuner operable to tune over spaced frequency bands upon predetermined movements of a tuning member, said tuner comprising in combination, a helical inductance coil corresponding to each circuit and having spaced portions of relatively low turn density and an intermediate portion of relatively great turn density, an adjustable capacitor defining a resonant circuit in conjunction with each coil, a magnetic core disposed within each of said coils and adjustably mounted relative thereto to calibrate said coils at the low frequency end of the tuning range, and a conductive tuning sleeve for each of said coils adapted to telescope over said core and adjustably mounted on the tuning member to calibrate said coils at a frequency intermediate the low and high tuning frequencies.

2. An inductor operable to tune a resonant circuit over spaced frequency bands upon predetermined movements of a tuning member, said inductor comprising in combination, a helical coil having spaced portions of relatively low turn density and an intermediate portion of relatively great turn density, a magnetic core disposed within said coil and adjustably mounted independently of the tuning member to calibrate the low frequency end of the tuning range, and a conductive tuning sleeve adapted to telescope over said core and within the coil and adjustably mounted on the tuning member to calibrate the inductor at a frequency intermediate the low and high tuning frequencies.

3. An inductor suitable for tuning a resonant circuit over two spaced frequency bands comprising in combination, a tuning member, a helical coil having spaced portions of relatively low turn density and an intermediate portion of relatively great turn density, a magnetic core disposed within said coil and adjustably mounted independently of the tuning member to calibrate the low frequency end of the tuning range and a conductive tuning sleeve mounted on the tuning member adapted to telescope over said core and within the coil.

4. A tuning unit for a radio receiver of the type wherein a plurality of circuits are tuned in unison by movements of a tuning member, said unit comprising a plurality of helical windings, adjustable capacitors connected to said windings to define resonant circuits in conjunction therewith, magnetic cores adjustably positioned within said windings, and conducting sleeves adapted to encompass more or less of said cores with movements of said tuning member and adjustably held on said tuning member.

5. A multicircuit tuner operable to tune over spaced frequency bands upon predetermined movements of a tuning member, said tuner comprising in combination, a helical inductance coil corresponding to each circuit and having spaced portions of relatively low turn density and an intermediate portion of relatively great turn density, a magnetic core disposed within each of said coils and adjustably mounted relative thereto to calibrate said coils at the low frequency end of the tuning range, a capacitor connected in circuit with each of said coils to define a resonant circuit in conjunction therewith and variable to calibrate said coils at the high frequency end of the tuning range, and a conductive tuning sleeve for each of said coils adapted to telescope over the corresponding core and adjustably mounted on the tuning member to calibrate said coils at a frequency intermediate the low and high tuning frequencies.

6. An inductor operable to tune over spaced frequency bands upon predetermined movements of a tuning member, said inductor comprising in combination, a helical coil having spaced portions of relatively low turn density and an intermediate portion of relatively great turn density, a magnetic core disposed within said coil mounted independently of the tuning member, and a low loss tuning sleeve adapted to telescope over said core and within the coil to tune said inductor.

7. An inductor tunable over a relatively wide frequency band and capable of being calibrated at a plurality of points therein comprising in combination, a winding defining an inductance, a magnetic core member operably associated with the winding and adjustably mounted relative thereto, a member movable independently of the core and the winding, and a shield movable in unison with the member adjustably positioned relative thereto and operative to extend between the core and the coil to shield the core from the coil in accord with the movements of the member.

8. An inductor tunable over a relatively wide frequency band and capable of being calibrated at a plurality of points therein comprising in combination, a winding defining an inductance, a magnetic core member operably associated with the winding and adjustably mounted relative thereto, a supporting member movable independently of the core and the winding, means to move the supporting member over a predetermined range of movement for station selection, and a shield carried by the supporting member adjustably positioned relative thereto and operative to shield the core from the coil in accord with the movements of the supporting member.

9. An inductor tunable over a relatively wide frequency band and capable of being calibrated at a plurality of points therein comprising in combination, a helical coil, a magnetic core member disposed within the coil and supported relatively thereto by means defining a threaded connection for adjustment of the core relative to the coil, a supporting member movable independently of the coil and the core, a conducting sleeve adapted to be received in the annular space between the core and coil, and means defining a threaded connection adjustably supporting the sleeve from the supporting member.

FREDERICK N. JACOB.
EARL R. STOUT.
LEONARD MILLER.

REFERENCES CITED

The following references are of record in the file of this patent:

UNITED STATES PATENTS

| Number | Name | Date |
|---|---|---|
| 2,259,250 | Jacob | Oct. 14, 1941 |
| 2,338,134 | Sands | Jan. 4, 1944 |
| 2,363,101 | Van Der Heem | Nov. 21, 1944 |
| 2,477,979 | Hadley | Aug. 2, 1949 |